United States Patent
Monroe et al.

(10) Patent No.: US 10,699,829 B2
(45) Date of Patent: Jun. 30, 2020

(54) CRYOGENICS FOR HTS MAGNETS

(71) Applicant: TOKAMAK ENERGY LTD, Oxfordshire (GB)

(72) Inventors: Charles Monroe, Gloucestershire (GB); Paul Noonan, Oxfordshire (GB)

(73) Assignee: TOKAMAK ENERGY LTD, Abingdon Oxfordshire (GB)

( * ) Notice: Subject to any disclaimer, the term of this patent is extended or adjusted under 35 U.S.C. 154(b) by 116 days.

(21) Appl. No.: 15/757,130

(22) PCT Filed: Sep. 1, 2016

(86) PCT No.: PCT/GB2016/052699
§ 371 (c)(1),
(2) Date: Mar. 2, 2018

(87) PCT Pub. No.: WO2017/037456
PCT Pub. Date: Mar. 9, 2017

(65) Prior Publication Data
US 2018/0261366 A1    Sep. 13, 2018

(30) Foreign Application Priority Data
Sep. 4, 2015    (GB) .................................. 1515701.9

(51) Int. Cl.
*H01F 1/00*    (2006.01)
*H01F 6/04*    (2006.01)
(Continued)

(52) U.S. Cl.
CPC .......... *H01F 6/04* (2013.01); *G01R 33/3804* (2013.01); *G21B 1/00* (2013.01); *G21B 1/11* (2013.01); *G21B 1/21* (2013.01)

(58) Field of Classification Search
CPC ....................................................... H01F 6/04
(Continued)

(56) References Cited

U.S. PATENT DOCUMENTS 1,894,753 A  *   1/1933    Cahoon .................... F28B 1/02
                                                     165/147
3,201,728 A  *   8/1965    McWhirter ............ H01F 27/18
                                                   336/60
(Continued)

FOREIGN PATENT DOCUMENTS

EP           1261118 A1    11/2002
GB          2241565 A      9/1991
(Continued)

OTHER PUBLICATIONS

Great Britian Search Report for Application No. GB1515701.9 dated Jan. 12, 2016; 4 pgs.
(Continued)

*Primary Examiner* — Alexander Talpalatski
(74) *Attorney, Agent, or Firm* — Cantor Colburn LLP

(57) ABSTRACT

A cooling system for use in a superconducting magnet comprising a high temperature superconductor, HTS, coil. The cooling system comprises a refrigeration unit, one or more coolant channels, and a pumping unit. The refrigeration unit is configured to cool a gas, wherein the gas is hydrogen or helium. The one or more coolant channels are configured to be placed in thermal contact with components of the superconducting magnet and to carry said gas. The pumping unit is configured to pump said gas through the coolant channels. The refrigeration unit and pumping unit are configured to maintain the gas at a pressure and temperature such that a Joule-Thompson coefficient of the gas is positive, and the coolant channel is configured to reduce the pressure of gas as it flows through the channel by one or more of a throttle, a valve, and choice and/or variance of a cross section of the coolant channel.

6 Claims, 4 Drawing Sheets

(51) Int. Cl.
  *G21B 1/21* (2006.01)
  *G21B 1/11* (2006.01)
  *G21B 1/00* (2006.01)
  *G01R 33/38* (2006.01)

(58) Field of Classification Search
  USPC .......................................................... 335/216
  See application file for complete search history.

(56) References Cited

U.S. PATENT DOCUMENTS

| | | | | |
|---|---|---|---|---|
| 4,510,771 A | * | 4/1985 | Matsuda | F17C 3/085 |
| | | | | 505/892 |
| 4,641,104 A | | 2/1987 | Blosser et al. | |
| 4,689,439 A | * | 8/1987 | Sato | F25D 3/10 |
| | | | | 174/11 R |
| 5,410,286 A | * | 4/1995 | Herd | F25D 29/001 |
| | | | | 335/216 |
| 5,508,613 A | | 4/1996 | Kotsubo et al. | |
| 7,430,871 B2 | * | 10/2008 | Strobel | F25B 9/02 |
| | | | | 250/286 |
| 9,494,344 B2 | * | 11/2016 | Kraus | G01R 33/3815 |
| 9,887,028 B2 | * | 2/2018 | Inoue | H01F 6/02 |
| 2015/0145624 A1 | * | 5/2015 | Weinberg | H01F 5/00 |
| | | | | 335/296 |
| 2017/0200541 A1 | * | 7/2017 | Inoue | H01F 6/02 |
| 2017/0284725 A1 | * | 10/2017 | Wikus | F25D 19/00 |

FOREIGN PATENT DOCUMENTS

| | | |
|---|---|---|
| GB | 2501191 A | 10/2013 |
| JP | S6476706 A | 3/1989 |
| JP | H0278207 A | 3/1990 |
| JP | H08222429 A | 8/1996 |
| JP | H10313136 A | 11/1998 |
| JP | 2006284062 A | 10/2006 |
| JP | S5420389 A | 2/2014 |
| WO | 2010043930 A1 | 4/2010 |

OTHER PUBLICATIONS

International Search Report and Written Opinion for International Application No. PCT/GB2016/052699 dated Dec. 19, 2016; 13 pgs.
International Preliminary Report on Patentability for Application No. PCT/GB2016/052699 dated Jan. 3, 2018; 15 pgs.

* cited by examiner

CRYOGENICS FOR HTS MAGNETS

CROSS REFERENCE TO RELATED APPLICATIONS

This application is a National Stage Application of Patent Application PCT/GB2016/052699 filed on Sep. 1, 2016, which claims the benefit of and priority to Great Britain Application No. GB1515701.9, filed Sep. 4, 2015, the contents of which are incorporated herein by reference in their entirety.

FIELD OF THE INVENTION

The invention relates to cryogenics for high temperature superconductor (HTS) magnets. In particular, the invention relates to cooling systems for such magnets and methods of cooling such magnets using hydrogen or helium gas as a coolant.

BACKGROUND

A superconducting magnet is an electromagnet formed from coils of a superconducting material. As the magnet coils have zero resistance, superconducting magnets can carry high currents with zero loss (though there will be some losses from non-superconducting components), and can therefore sustain high fields with much lower energy losses than conventional electromagnets.

Superconductivity only occurs in certain materials, and only at low temperatures. A superconducting material will behave as a superconductor in a region defined by the critical temperature of the superconductor (the highest temperature at which the material is a superconductor in zero magnetic field) and the critical field of the superconductor (the highest magnetic field in which the material is a superconductor at 0K). The temperature of the superconductor and the magnetic field present limit the current which can be carried by the superconductor without the superconductor becoming resistive.

Broadly speaking, there are two types of superconducting material. Low temperature superconductors (LTS) have critical temperatures below 30K-40K, and high temperature superconductors (HTS) have critical temperatures above 30K-40K.

As the magnets require cooling to low temperatures, they are typically contained within a cryostat designed to minimise heating of the magnet. Such a cryostat typically comprises a vacuum chamber to minimise heating by convection or conduction, and may comprise one or more heat shields at temperatures intermediate between the temperature of the magnet and the external temperature to minimise heating by radiation.

The magnet itself is further cooled either by immersion in a liquid with a low boiling point (such as liquid nitrogen (77K), or liquid helium (4K)), or by circulating a coolant through the magnet and a cryocooler.

Efficient cooling is particularly important in applications where there are external heat sources. For example, in a nuclear fusion reactor such as a spherical tokamak, the fusion reactor generates a huge amount of heat, which means that the cooling system for the magnets must mitigate the heat production to keep the magnets at the correct operating temperature. Certain magnet geometries or constructions may also have regions which generate more heat than the rest of the magnet (e.g. joints in the superconductor).

SUMMARY

According to one aspect of the present invention there is provided a cooling system for use in a superconducting magnet comprising a high temperature superconductor, HTS, coil. The cooling system comprises a refrigeration unit, one or more coolant channels, and a pumping unit. The refrigeration unit is configured to cool a gas, which will usually be hydrogen or helium. The one or more coolant channels are configured to be placed in thermal contact with components of the superconducting magnet and to carry said gas. The pumping unit is configured to pump said gas through the coolant channels. The refrigeration unit and pumping unit are configured to maintain the gas at a pressure and temperature such that a Joule-Thompson coefficient of the gas is positive, and the coolant channel is configured to reduce the pressure of gas continually along a section of the channel in thermal contact with components of the superconducting magnet and/or at a plurality of pressure drops along said section as it flows through the channel by one or more of
a plurality of throttles;
a plurality of valves; and
variation of a cross section of the coolant channel.

The coolant channel may be configured to reduce the pressure so as to maintain substantially constant temperature along the coolant channel.

The coolant channel may be configured to provide a greater decrease in pressure in a selected region of the coolant channel. The selected region may be selected in order to provide additional cooling to a component of the superconducting magnet which is in proximity to the selected region during operation of the magnet.

The refrigeration unit may be configured to maintain the gas at a temperature above the critical temperature of the gas.

According to another aspect of the present invention there is provided a superconducting magnet comprising an HTS coil and a cooling system as described above.

The superconducting magnet may comprise a joint in the HTS coil, and the selected region where a greater decrease of pressure is provided may be selected in order to provide additional cooling to the joint.

According to a further aspect of the present invention there is provided a nuclear fusion reactor comprising:
  a toroidal field coil comprising high temperature superconductor, HTS;
  a poloidal field coil;
  a spherical tokamak plasma chamber;
  a cooling system according to the first aspect and configured to cool at least one of the field coils.

According to a yet further aspect of the present invention there is provided a method of cooling a superconducting magnet comprising an HTS coil. A flow of gas is provided at a pressure and temperature such that a Joule-Thompson coefficient of the gas is positive to a coolant channel in thermal contact with the superconducting magnet. The coolant channel is configured to reduce the pressure of gas continually along a section of the channel in thermal contact with components of the superconducting magnet and/or at a plurality of pressure drops along said section as it flows through the channel by one or more of
a plurality of throttles;
a plurality of valves; and
variation of a cross section of the coolant channel.

According to a yet further aspect, there is provided the use of hydrogen gas as a coolant for a superconducting magnet comprising a high temperature superconductor, HTS, coil.

DETAILED DESCRIPTION

When an ideal gas is subject to an adiabatic free expansion, i.e. when it expands without doing work, and without exchanging heat (e.g. when it is forced through a valve or porous plug, or made to flow along a pipe of increasing diameter), there is no temperature change. This is because there is no change in internal energy, and in the ideal gas model internal energy directly relates to temperature.

For real gasses, this is not the case. Internal energy can also exist due to intermolecular forces, and so the expansion of a gas can store or release energy. Therefore, when a real gas is subject to an adiabatic free expansion, it will change in temperature. This is known as the Joule-Thomson (J-T) effect (sometimes "Joule-Kelvin effect")

Whether the gas heats or cools depends on the gas, the temperature, and the pressure. A J-T coefficient can be determined for a gas, which depends on the temperature and pressure. If the coefficient is positive, the gas will cool when it expands, if the coefficient is negative, the gas will heat when it expands. At a set pressure, the temperature at which the coefficient is zero is called the J-T inversion temperature for a gas, and the line on a graph of pressure versus temperature at which the J-T temperature is zero is called the J-T inversion curve. At temperatures below the J-T inversion temperature (or the J-T inversion curve), the J-T coefficient is positive, and so the gas cools when it expands. For the remainder of this disclosure, "below the J-T curve" means at a lower temperature than the J-T curve.

The more positive the J-T coefficient, i.e. the further below the J-T curve, the greater the cooling will be for a given pressure decrease.

At room temperature (300K) and pressure (1 atmosphere), all gasses except helium, hydrogen, and neon have a positive J-T coefficient, and so will cool upon adiabatic free expansion.

Figure 1A:
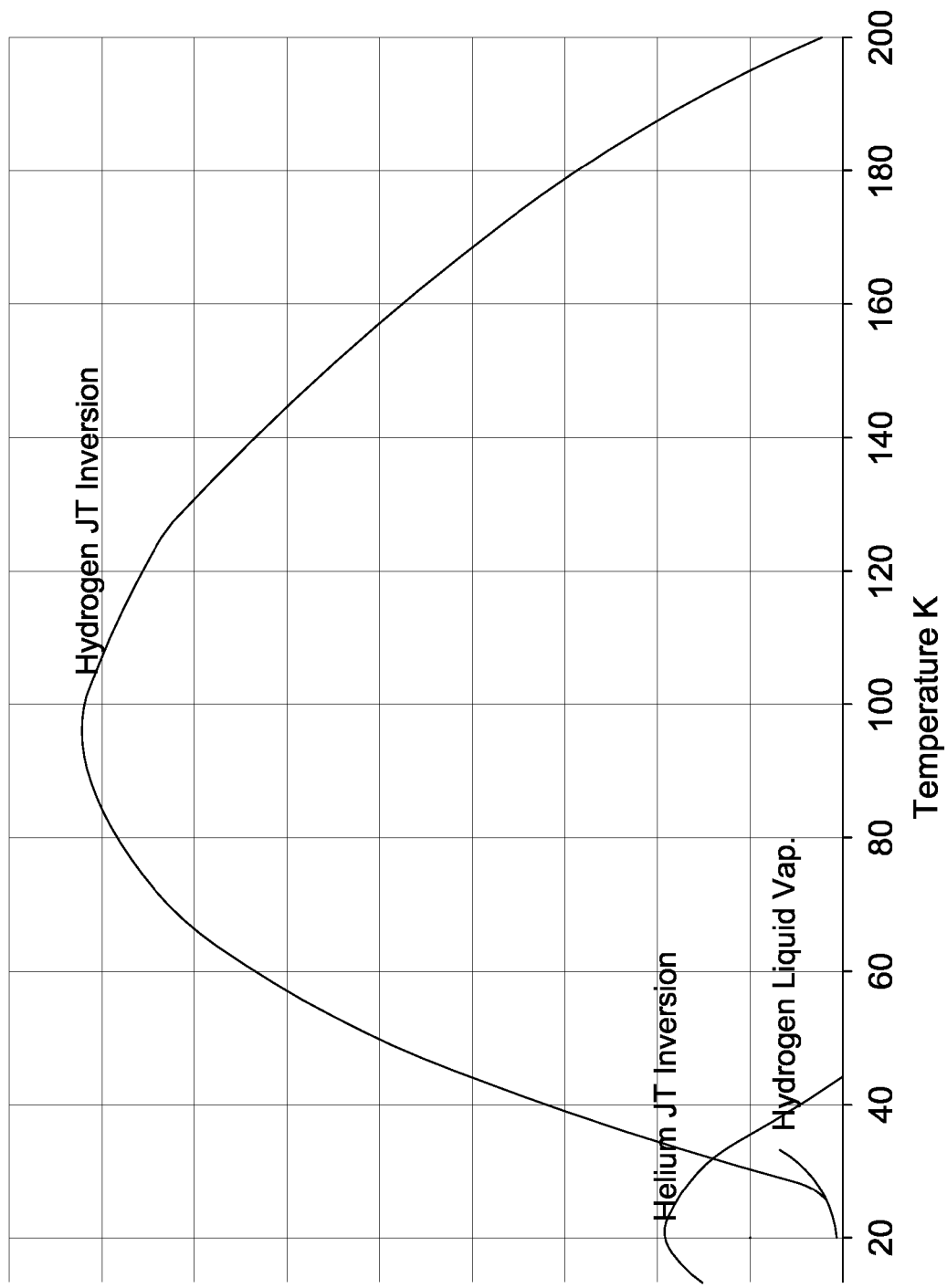
FIG. 1a is a graph of pressure versus temperature showing the Joule-Thompson inversion curve for hydrogen and helium.
Figure 1B:
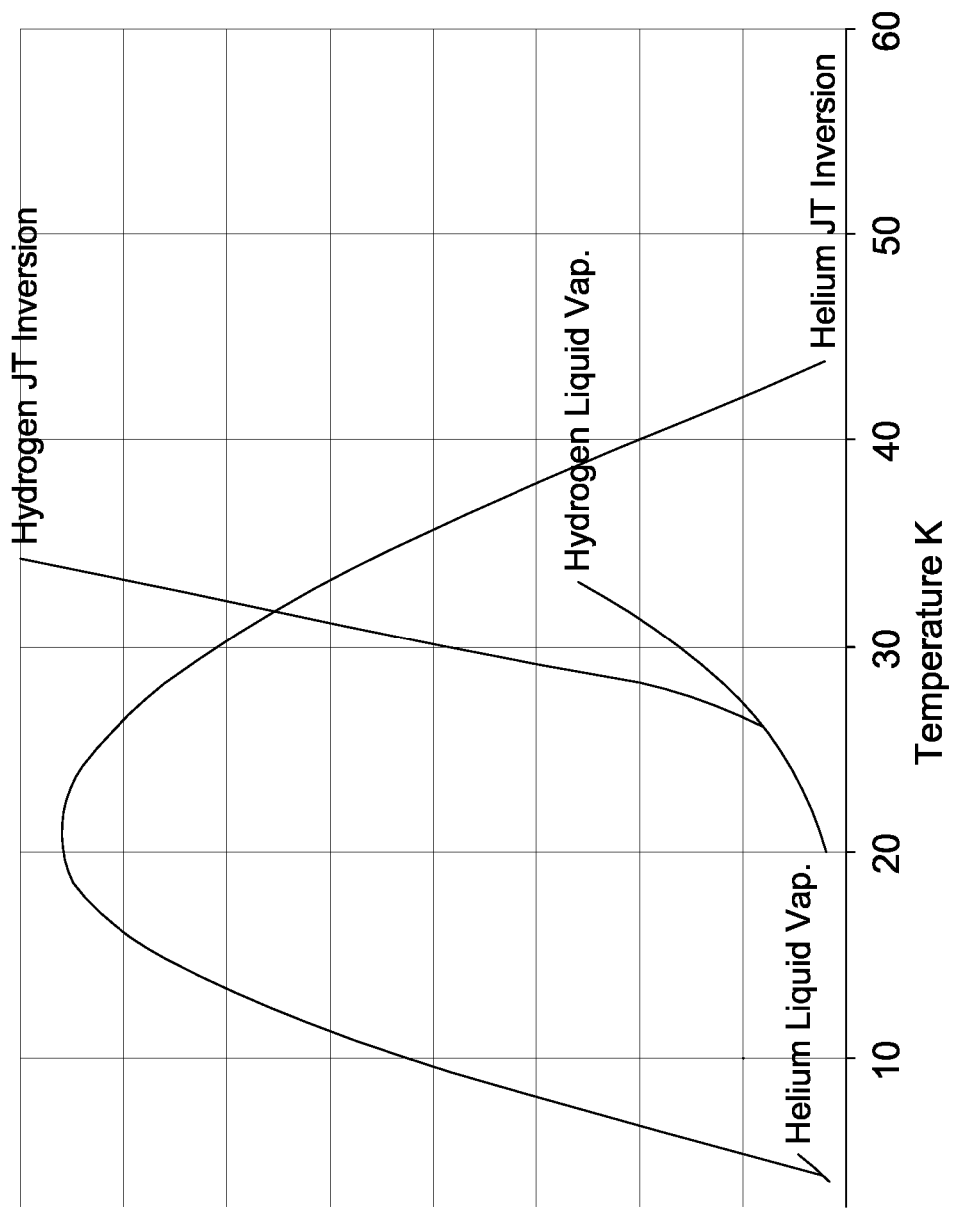
FIG. 1b is a graph of pressure versus temperature showing the Joule-Thompson curve for helium in greater detail.

The J-T curves for hydrogen and helium are shown in FIG. 1a, with FIG. 1b showing the helium curve in greater detail, along with the liquid-vapour phase change of hydrogen and helium. As can be seen from the graphs, hydrogen and helium will cool upon adiabatic free expansion at typical operating temperatures of HTS magnets (around 30-40K). This can be exploited to provide improved cooling to HTS magnets.

Figure 2B:
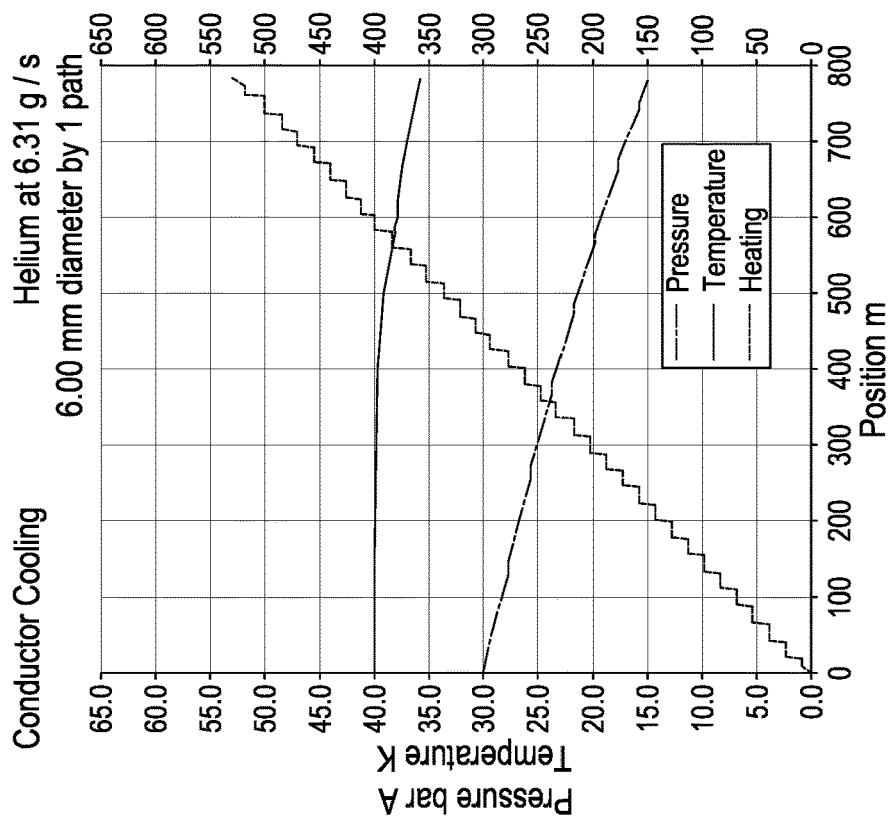
FIG. 2b is a graph showing pressure, temperature, and applied heat for a flow of hydrogen.
Figure 2A:
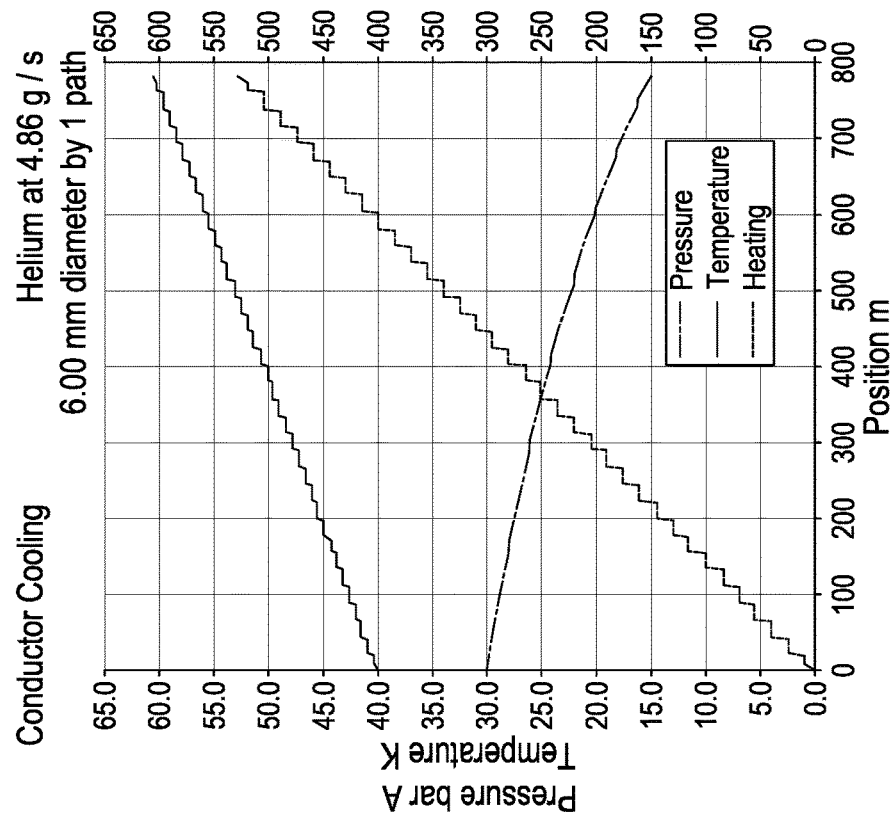
FIG. 2a is a graph showing pressure, temperature, and applied heat for a flow of helium.

By configuring the coolant flow to provide controlled pressure drops, a system for cooling an HTS magnet using hydrogen or helium can provide localised cooling to specific areas, or additional cooling along the flow. The temperature drop in the hydrogen or helium due to the J-T effect is balanced by the heat absorbed from the surroundings, which means that the temperature of the gas remains approximately constant, but additional localised cooling is provided to the surroundings. This can be seen in FIGS. 2a and 2b, which plots the heat input to the system alongside pressure and temperature of the gas for a system. In both cases, the gas starts at 30 bar and 40K FIG. 2a shows the flow of helium along a pipe with a steadily decreasing pressure and a heating rate increasing by steps. FIG. 2b shows the flow of hydrogen along the pipe under the same conditions. As can be clearly seen, the helium (which is above the J-T curve) provides much less effective cooling than the hydrogen (which is below the J-T curve). In fact, the hydrogen experiences a drop in temperature along the pipe, despite being subject to 500 W of heating by the end.

Hydrogen gas is particularly suited for use as a refrigerant due to its high heat capacity. However, hydrogen cooling by the J-T effect will only work at temperatures above about 27K (as can be seen from the graph in FIG. 2), and preferably above the critical point of hydrogen (33.1K) to avoid condensation and evaporation. Above the J-T curve, hydrogen gas may still be used as an effective coolant due to its high heat capacity in comparison to helium, but the additional advantages from exploiting the J-T effect will not be available. Below 44K, helium may be used for cooling by the J-T effect, and helium will be most effective at around 20K.

In order to provide localised cooling for certain components, the gas may be passed through a throttle or valve from a high pressure region to a low pressure region, with the localised cooling occurring on the low pressure side. This sudden extra cooling may be used for components such as joints which are expected to produce high localised heat, or to provide more effective cooling in a smaller region for space restricted areas such as the central column of a spherical tokamak nuclear fusion reactor.

In conventional systems, as the coolant flows through the system the temperature of the coolant will increase. With a system using the J-T effect, the temperature of the coolant can be kept approximately constant along the flow by gradually reducing the pressure, particularly along the section of the coolant channel in thermal contact with the other components of the superconducting magnet, e.g. by choosing the cross-section of the coolant channel so that the reduction in pressure due to change in viscosity will balance out the heating as the coolant travels along the channel. The cross-sectional area of the flow may be varied along the length of the channel to increase or reduce this effect. Alternatively or in addition, staged pressure drops using throttles or valves could be used to bring the temperature back down at intervals along the coolant channel. For an HTS field coil, the coolant channels could be co-wound with the HTS conductor and configured to provide a steady temperature along the length of the conductor.

Figure 3:
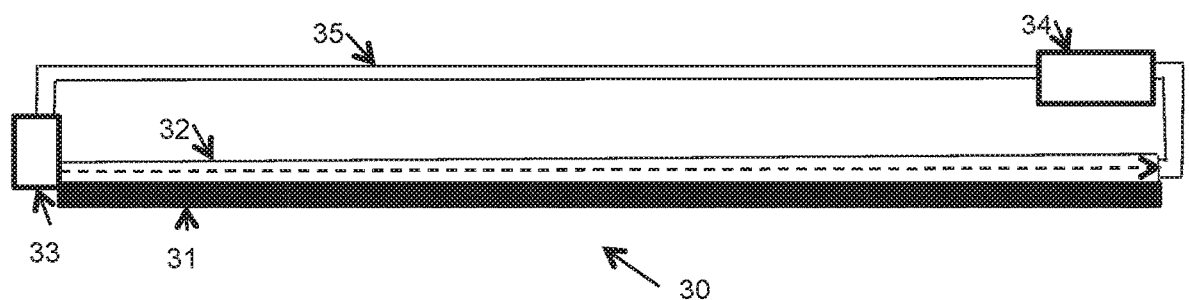
FIG. 3 is a schematic diagram of a cooling system according to an embodiment.

FIG. 3 shows a cooling system 30 according to an embodiment. The cooling system 30 is configured to cool a field coil 31 comprising high temperature superconductor, which is shown straightened for simplicity. The coolant gas (hydrogen or helium) flows through a coolant channel 32, which is thermally connected to the field coil 31. The gas is cooled by a refrigeration unit 33, and pumped around the system by a pump 34, which together ensure that the coolant gas is kept in the region below the J-T curve. A return channel 35 may be provided to complete the loop of the system if required. The cross sectional area of the coolant channel 32 is selected and/or varied in order to provide a continual decrease in pressure, and thus prevent the coolant from warming as it travels along the coolant channel.

Figure 4:
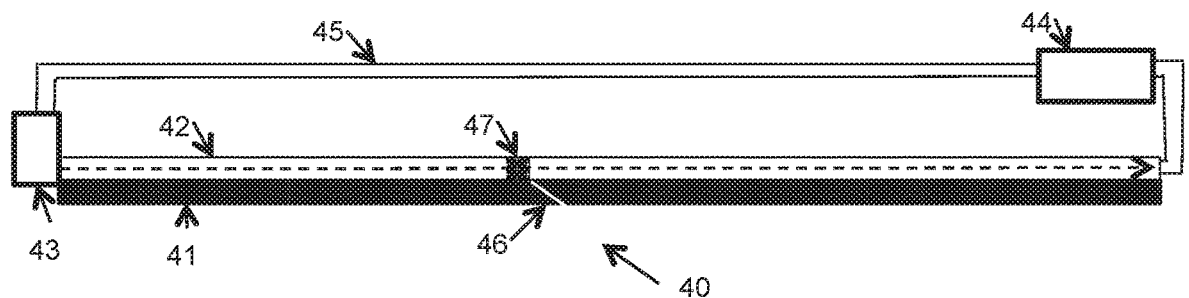
FIG. 4 is a schematic diagram of a cooling system according to a further embodiment.

FIG. 4 shows a cooling system 40 according to an alternative embodiment. As before, the cooling system 40 is configured to cool a field coil 41 comprising high temperature superconductor, which is shown straightened for simplicity. The coolant gas (hydrogen or helium) flows through a coolant channel 42, which is thermally connected to the field coil 41. The gas is cooled by a refrigeration unit 43, and pumped around the system by a pump 44. A return channel 45 may be provided to complete the loop of the system if required. In this example, the field coil comprises a joint 46, or other component which is likely to generate a large amount of heat. A throttle or valve 47 is placed in the coolant channel 42, so that the region of the coolant channel 42 upstream of the throttle or valve is at a higher pressure than the region downstream of the throttle or valve 47. The sudden decrease in pressure as the coolant gas exits the throttle or valve 47 results in a localised cooling effect for the joint 46.

The systems presented in FIGS. 3 and 4 are by example only, and the principles shown therein may be combined in many ways. For example, a continual decrease in pressure may be provided by spacing throttles or valves at intervals along the coolant channel, and/or a sudden decrease in pressure for localised cooling may be obtained by quickly changing the cross sectional area of the coolant channel along its length. The two approaches may be combined, e.g. having throttles or valves in a channel of varying cross sectional area in order to achieve the desired pressure profile along the length of the channel.

The invention claimed is:

1. A cooling system comprising a high temperature superconductor, HTS, coil; and the cooling system having:
   a refrigeration unit configured to cool a gas, wherein the gas is hydrogen or helium;
   one or more coolant channels configured to be placed in thermal contact with components of the superconducting magnet and to carry said gas to provide a greater decrease in pressure in a selected region of the coolant channel; wherein:
      the superconducting magnet comprises a joint in the HTS coil;
      the selected region is selected in order to provide additional cooling to the joint, and arranged such that the joint is in proximity to the selected region during operation of the magnet;
   a pumping unit configured to pump said gas through the coolant channels;
   wherein the refrigeration unit and pumping unit are configured to maintain the gas at a pressure and temperature such that a Joule-Thompson coefficient of the gas is positive, and the coolant channel is configured to reduce the pressure of gas continually along a section of the channel in thermal contact with components of the superconducting magnet and/or at a plurality of pressure drops along said section as it flows through the channel by one or more of:
      plurality of throttles;
      plurality of valves; and
      variation of a cross section of the coolant channel.

2. A cooling system according to claim 1, wherein the coolant channel is configured to reduce the pressure so as to maintain substantially constant temperature along the coolant channel.

3. A cooling system according to claim 1, wherein the refrigeration unit is configured to maintain the gas at a temperature above the critical temperature of the gas.

4. A cooling system according to claim 1, wherein the refrigeration unit is configured to cool a nuclear fusion reactor comprising:
   a toroidal field coil comprising high temperature superconductor, HTS;
   a poloidal field coil;
   a spherical tokamak plasma chamber.

5. A superconducting magnet comprising:
   an HTS coil; and,
   a cooling system comprising:
      a refrigeration unit configured to cool a gas, wherein the gas is hydrogen or helium;
      one or more coolant channels configured to be placed in thermal contact with components of the superconducting magnet and to carry said gas;
      a pumping unit configured to pump said gas through the coolant channels;
      wherein the refrigeration unit and pumping unit are configured to maintain the gas at a pressure and temperature such that a Joule-Thompson coefficient of the gas is positive, and the coolant channel is configured to reduce the pressure of gas continually along a section of the channel in thermal contact with components of the superconducting magnet and/or at a plurality of pressure drops along said section as it flows through the channel by one or more of:
         plurality of throttles;
         plurality of valves; and
         variation of a cross section of the coolant channel,
      wherein:
         the coolant channel is configured to provide a greater decrease in pressure in a selected region of the coolant channel;
         the superconducting magnet comprises a joint in the HTS coil;
         the selected region is selected in order to provide additional cooling to the joint, and arranged such that the joint is in proximity to the selected region during operation of the magnet.

6. A method of cooling a superconducting magnet comprising an HTS coil, the method comprising:
   cooling a gas with a refrigeration unit, wherein the gas is hydrogen or helium;
   placing the one or more coolant channels in contact with components of the superconducting magnet and to carry the gas;
   pumping the gas through the through the coolant channels;
   providing a flow of the gas at a pressure and temperature such that a Joule-Thompson coefficient of the gas is positive to a coolant channel in thermal contact with the superconducting magnet; and
   reducing the pressure of gas continually along a section of the channel in direct thermal contact with components of the superconducting magnet or at a plurality of pressure drops along said section as it flows through the channel by one or more of:
      plurality of throttles;
      plurality of valves;
      a variation of cross section of the coolant channel; and
   providing a greater decrease in pressure in a region of the cooling channel in proximity to a joint of the HTS coil during operation of the magnet.

* * * * *